US008736476B2

(12) United States Patent
Gong et al.

(10) Patent No.: US 8,736,476 B2
(45) Date of Patent: May 27, 2014

(54) MODIFIED FIRST-ORDER NOISE-SHAPING DYNAMIC-ELEMENT-MATCHING TECHNIQUE

(71) Applicant: Silicon Laboratories Inc., Austin, TX (US)

(72) Inventors: Xue-Mei Gong, Austin, TX (US); Douglas F. Patorello, Hudson, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/664,902

(22) Filed: Oct. 31, 2012

(65) Prior Publication Data

US 2014/0118172 A1  May 1, 2014

(51) Int. Cl.
*H03M 1/66* (2006.01)
*H03M 1/06* (2006.01)

(52) U.S. Cl.
CPC .............. *H03M 1/66* (2013.01); *H03M 1/0673* (2013.01)
USPC ............................ 341/144; 341/145; 341/150

(58) Field of Classification Search
CPC .................................................... H03M 1/0673
USPC .......................................... 341/144, 145, 150
See application file for complete search history.

(56) References Cited

U.S. PATENT DOCUMENTS 5,684,482 A * 11/1997 Galton ........................... 341/144
6,137,430 A * 10/2000 Lyden et al. .................. 341/145
6,266,002 B1 * 7/2001 Gong et al. ................... 341/150
6,466,147 B1 * 10/2002 Jensen et al. ................. 341/144
6,545,547 B2 * 4/2003 Fridi et al. ...................... 331/16
2009/0243904 A1 * 10/2009 Lee et al. ...................... 341/144

OTHER PUBLICATIONS

Adams, R. et al., "A 113-dB SNR Oversampling DAC with Segmented Noise-Shaped Scrambling," IEEE Journal of Solid-State Circuits, vol. 33, No. 12, Dec. 1998, pp. 1871-1878.
Aghdam, E., et al., "Completely first order and tone free partitioned data weighted averaging technique used in a multibit delta sigma modulator," IEEE 19th European Conference on Circuit Theory and Design (ECCDT'09), Antalya, Turkey, version 1, Jan. 6, 2010, 4 pages.
Galton, I., "Why Dynamic-Element-Matching DACs Work," IEEE Transactions on Circuits and Systems—II: Express Briefs, vol. 57, No. 2, Feb. 2010, pp. 69-74.
Lin, Y. et al., "High-Speed DACs with Random Multiple Data-Weighted Averaging Algorithm," Circuits and Systems, May 25-28, 2003, pp. I-993 to I-996.
Schreier, R. and Temes, G., "Understanding Delta-Sigma Data Converters," IEEE Press, 2005, pp. 184-196; 229-236.

* cited by examiner

*Primary Examiner* — Jean B Jeanglaude
(74) *Attorney, Agent, or Firm* — Abel Law Group, LLP

(57) ABSTRACT

A technique includes selectively enabling a first sequence of unit elements of a plurality of unit elements of a digital-to-analog converter to convert a digital code to a plurality of analog signals in response to a plurality of control signals. Individual control signals of the plurality of control signals and individual analog signals of the plurality of analog signals correspond to respective unit elements of the plurality of unit elements. The technique includes generating the plurality of control signals based on the digital code, a random digital code having a number of bits based on a feedback signal, and an indicator of a second sequence of unit elements of the plurality of unit elements enabled in response to a prior digital code.

20 Claims, 7 Drawing Sheets

MODIFIED FIRST-ORDER NOISE-SHAPING DYNAMIC-ELEMENT-MATCHING TECHNIQUE

BACKGROUND

1. Field of the Invention

This invention relates to integrated circuits and more particularly to digital-to-analog converter integrated circuits.

2. Description of the Related Art

In general, a multi-bit digital-to-analog converter converts a sequence of digital codewords, into one or more analog waveforms. A typical multi-bit digital-to-analog converter updates an analog signal at a uniform sampling interval. The analog signal is generated using multiple individual electrical components (e.g., resistors, capacitors, and/or current sources) that generate individual analog signals for each bit or possible value of an input digital code. The multiple individual electrical components may be coupled to a summing node and the individual analog signals sum to an output analog signal that has a value corresponding to the value of the input digital code. The input digital code may be binary-weighted and the individual electrical components may be sized to generate binary-weighted outputs. Although the binary-weighted digital-to-analog converter is relatively fast, it suffers from poor accuracy.

A thermometer-coded digital-to-analog converter is relatively fast and has relatively high-precision. The thermometer-coded digital-to-analog converter receives a thermometer-coded codeword and includes an individual electrical component for each possible value of the input digital codeword. Referring to FIG. 1, a K-bit (e.g., 8-bit) thermometer-coded digital-to-analog converter includes $M=2^K$ (e.g., 256) individual electrical components. In a typical thermometer-coded digital-to-analog converter including M unit elements 106, element mismatches introduce an error in the output analog signal, s(n). The error may include harmonics of the input signal. Referring to FIG. 2, a dynamic-element-matching (DEM) technique reduces the output error of the thermometer-coded digital-to-analog converter. For example, if the value of the input digital code is J, then dynamic element-matching encoder 202, which may be a digital control circuit, controls the data conversion by activating J of the M unit elements. Dynamic element-matching encoder 202 chooses which J unit elements are activated in an order that reduces effects of any element mismatch. Although known dynamic-element-matching techniques may reduce tones in the output analog signal, those techniques do not entirely eliminate the tones and/or may introduce noise into the output analog signal. The noise and tones in the output analog signal may affect the realizable performance of a system using the analog signal and may not be acceptable for some applications. Accordingly, new dynamic-element matching techniques are desired.

SUMMARY OF EMBODIMENTS OF THE INVENTION

In at least one embodiment of the invention, a method includes selectively enabling a first sequence of unit elements of a plurality of unit elements of a digital-to-analog converter to convert a digital code to a plurality of analog signals in response to a plurality of control signals. Individual control signals of the plurality of control signals and individual analog signals of the plurality of analog signals correspond to respective unit elements of the plurality of unit elements. The method includes generating the plurality of control signals based on the digital code, a random digital code having a number of bits based on a feedback signal, and an indicator of a second sequence of unit elements of the plurality of unit elements enabled in response to a prior digital code. The method may include adjusting the number of bits of the random digital code based on the feedback signal and at least one of a target periodic error and a target noise level.

In at least one embodiment of the invention, an apparatus includes a digital-to-analog converter circuit comprising a plurality of unit elements configured to convert a digital code to a plurality of analog signals in response to a plurality of control signals. Individual control signals of the plurality of control signals and individual analog signals of the plurality of analog signals correspond to respective unit elements of the plurality of unit elements. The apparatus includes a control circuit configured to generate the plurality of control signals based on the digital code, a random digital code having a number of bits based on a feedback signal, and an indicator of a second sequence of unit elements of the plurality of unit elements enabled in response to a prior digital code. The apparatus may include a feedback controller configured to adjust the number of bits of the random digital code based on the feedback signal and at least one of a target periodic error and a target noise level.

BRIEF DESCRIPTION OF THE DRAWINGS

The present invention may be better understood by, and its numerous objects, features, and advantages made apparent to, those skilled in the art by referencing the accompanying drawings.

DETAILED DESCRIPTION

Figure 3A:
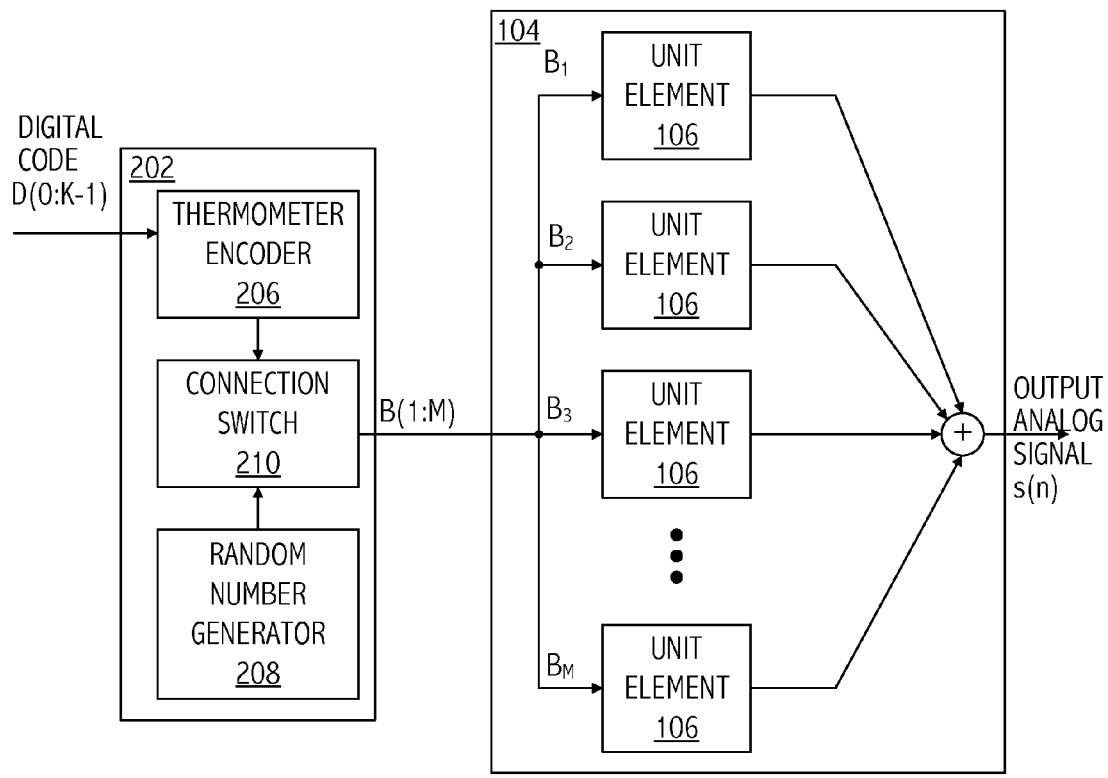
FIG. 3A illustrates a functional block diagram of a $0^{th}$ order noise-shaping dynamic-element-matching, thermometer-coded digital-to-analog converter.

Referring to FIG. 3A, dynamic-element-matching encoder 202 may implement a mismatch-scrambling technique that converts errors from non-linear distortion to pseudorandom noise that is uncorrelated with the input signal. Dynamic-element-matching encoder 202 includes thermometer encoder 206 that converts a K-bit binary digital code to an M-bit thermometer code. Connection switch 210 generates M control signals B(1:M) that select which unit elements 106 of digital-to-analog converter 104 are enabled based on the thermometer code and a random number, RN, generated by random number generator 208. Digital-to-analog converter 104 sums the analog signals generated by unit elements 106 to generate an output analog signal, s(n). Data conversion of the input signal is performed by activating J unit elements if the value of the digital code is J. Dynamic-element-matching encoder 202 achieves error randomization by choosing the particular J unit elements randomly each time. The resulting digital-to-analog converter error at time n will not be correlated with the value of its input and signal distortion is replaced by random noise in the digital-to-analog converter output, i.e., the resulting error increases the noise floor of the analog output signal s(n). Since the mismatch-scrambling technique provides no noise shaping, it may be referred to herein as a $0^{th}$ order noise-shaping dynamic-element-matching technique.

Figure 3B:
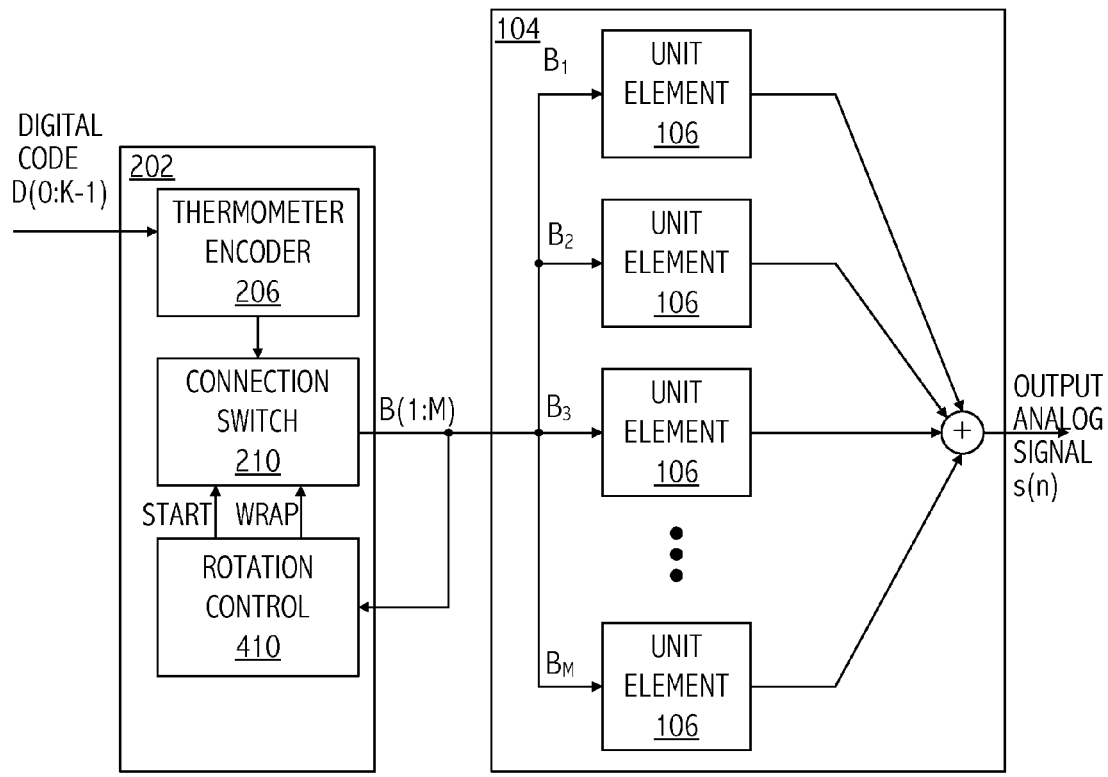
FIG. 3B illustrates a functional block diagram of a $1^{st}$ order noise-shaping dynamic-element-matching, thermometer-coded digital-to-analog converter.

Referring to FIG. 3B, in another embodiment, dynamic-element-matching encoder 202 implements a mismatch-error-shaping technique. The mismatch error introduced by uneven spacings of the digital-to-analog converter levels generated by mismatched unit elements is reduced by suppressing the noise spectrum in the signal frequency band and shifting power of the noise spectrum to out-of-band frequencies. Dynamic-element-matching encoder 202 implements an element rotation (i.e., data-weighted averaging) technique that makes the long-term average use of each unit element in the digital-to-analog converter approximately the same by rotating the pattern of enabled unit elements. Dynamic-element-matching encoder 202 generates control signals that enable groups of elements in sequence based on the digital code and modular (i.e., modulo K) selection of unit elements to be enabled, as indicated by a start pointer and a wrap indicator generated by rotation control unit 410.

For example, a digital-to-analog converter has eight unit elements ($U_1, U_2, U_3, \ldots U_8$). If the first input code is 4, then dynamic-element-matching encoder 202 enables the first four unit elements, $U_1, U_2, U_3$, and $U_4$. If the next input code is 3, then dynamic-element-matching encoder 202 enables the next three unit elements, $U_5, U_6$, and $U_7$. If the next code is 4, then the sequence of enabled unit elements wraps around, and dynamic-element-matching encoder 202 enables unit elements $U_8, U_1, U_2$, and $U_3$ are enabled. The technique enables all unit elements sequentially and as frequently as possible. As a result, the mismatch noise is shaped by a first-order high-pass filter function. That is, noise energy is concentrated in high-frequency spectrum. Accordingly, the element rotation technique is referred to herein as a $1^{st}$ order noise-shaping dynamic-element-matching technique. For a signal s(n), the mismatch noise may be represented as e(n)=s(n)−s(n−1). For a random input signal, $E(\omega) = |1-e^{j\omega}|^2 \times S(\omega)$. The mismatch noise can be attenuated or eliminated in the output signal by using low-pass filtering techniques. However, if the input digital code is not a busy random signal, but rather is a DC or periodic signal, then the element rotation technique results in an error signal with a tonal character (i.e., the error signal includes spurs).

Dynamic-element-matching encoder 202 may implement a modified-first order noise-shaping dynamic-element-matching technique that combines $1^{st}$ order noise shaping with a $0^{th}$ order noise-shaping, randomization technique. Rather than selecting a sequence of elements to be enabled sequentially from the last enabled element of a prior sequence of enabled elements, dynamic-element-matching encoder 202 selects a sequence of elements to be enabled by offsetting a last enabled element of the prior sequence of enabled elements with a random number and selects the elements to be enabled using modular arithmetic. Note that the random number may be positive or negative.

Figure 4:
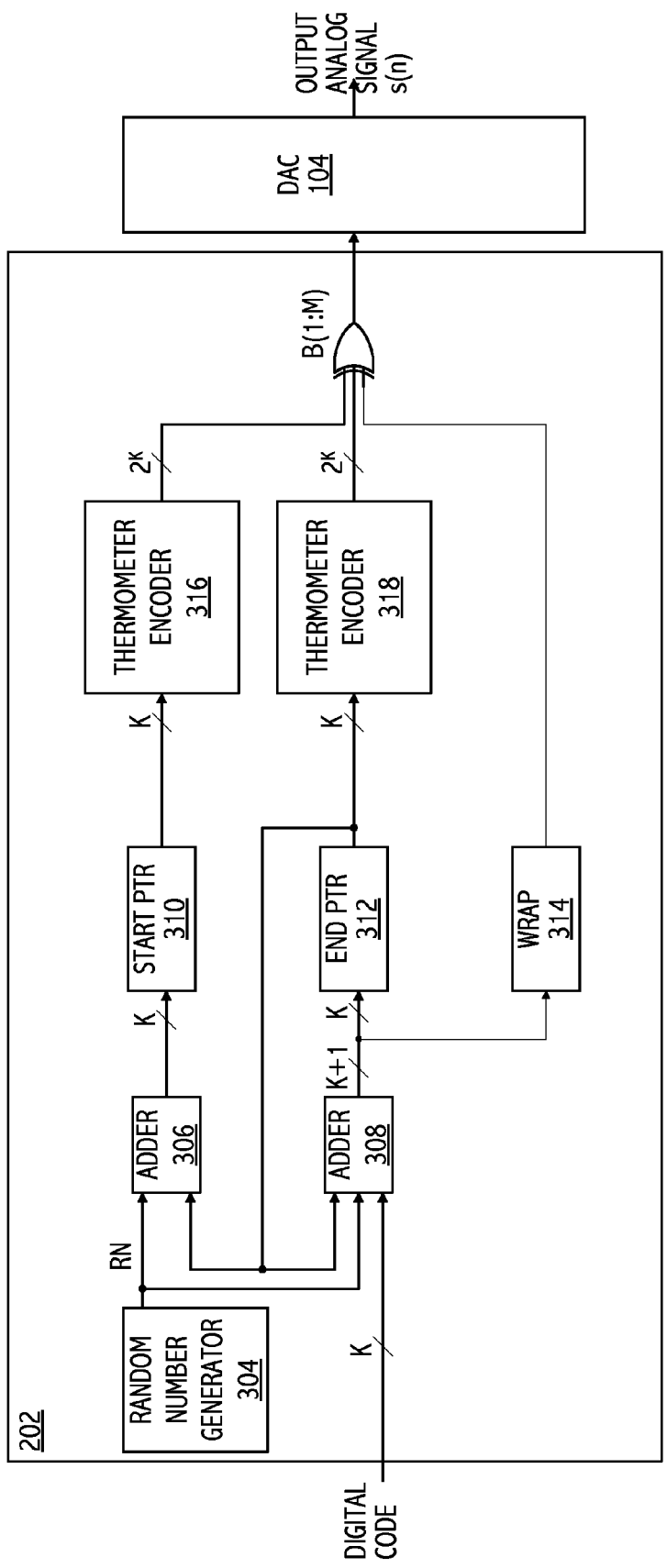
FIG. 4 illustrates a functional block diagram of a modified $1^{st}$ order noise-shaping dynamic-element-matching, thermometer-coded digital-to-analog converter consistent with at least one embodiment of the invention.

Referring to FIG. 4, dynamic-element-matching encoder 202 generates start pointer 310, end pointer 312, and wrap indicator 314 based on an input digital code and a random number, RN, generated by random number generator 304, which may include a linear feedback shift register. Start pointer 310 indicates that a next element to be enabled is a first element of a sequence of elements to be enabled to generate analog signals corresponding to the digital code. Start pointer 310 is generated by adding the random number to the last element of a prior sequence of elements enabled to generate analog signals corresponding to a prior digital code (e.g., START_POINTER(n)=END_POINTER(n−1)+RN(n)). End pointer 312, which indicates a last element to be enabled of the sequence of elements to be enabled to generate the analog signals corresponding to the digital code, is generated by modular addition (i.e., mod K) of the digital code and the random number to the last element of a prior sequence of elements enabled to generate analog signals corresponding to a prior digital code (e.g., END_POINTER(n)=(DIGITAL_CODE(n)+END_POINTER(n−1)+RN(n))$_M$=(DIGITAL_CODE(n)+START_POINTER(n))$_M$). The modular addition may be computed as the least-significant K bits of the sum of the digital code and the random number to the last element of a prior sequence of elements enabled to generate analog signals corresponding to a prior digital code. The most-significant bit of that sum is the wrap indicator, which indicates whether the sequence of enabled elements wraps around, i.e., whether the start pointer points to an element at a higher location in the sequence than the element pointed to by the end pointer.

The control signals, B, may be generated based on thermometer-encoded versions of start pointer 310 and end pointer 312. For example, outputs of thermometer encoder 316 and thermometer encoder 318 are combined with the wrap indicator using an exclusive-OR (i.e., XOR) operation to generate the control signals for multi-bit digital-to-analog converter 104. However, note that the logical and arithmetic operations used to generate the control signals for multi-bit digital-to-analog converter 104 may be generated using other different, but logically and arithmetically equivalent combinations of operations. The resulting error signal e(n) has improved spur behavior, i.e., tones have reduced occurrence or are eliminated. In addition, error signal e(n) has an increased noise-floor, but has some noise shaping.

In at least one embodiment of the modified $1^{st}$ order noise-shaping dynamic-element-matching technique, random number generator 304 provides a 1-bit randomly-generated code. That embodiment will provide the most noise shaping while reducing tones in the error signal. In other embodiments of the modified $1^{st}$ order noise-shaping dynamic-element-matching technique, random number generator 304 provides a multi-bit, randomly generated code that increases the spur reduction, but reduces noise-shaping effects. The number of bits of the random digital code may be chosen to achieve a particular tradeoff between noise shaping and spur reduction in an application in which the digital code has predictable characteristics (e.g., periodicity). Note that if the number of bits in the random digital code is large enough, the noise-shaping effects of the element rotation are negligible.

However, in some applications, characteristics of the digital code may not be predictable and/or may vary during system operation. Dynamic-element-matching encoder 202 may implement a modified-first order noise-shaping dynamic-element-matching technique that adjusts the amounts of noise shaping and spur reduction by varying the number of bits in the random digital code. The number of bits in the random digital code may be predetermined during an initialization operation by reading a fixed or variable storage element, pin, or other suitable device. In addition, the number of bits of the random digital code may be dynamically updated during system operation based on a target noise level at one or more frequencies and/or a target spur performance.

Figure 2:
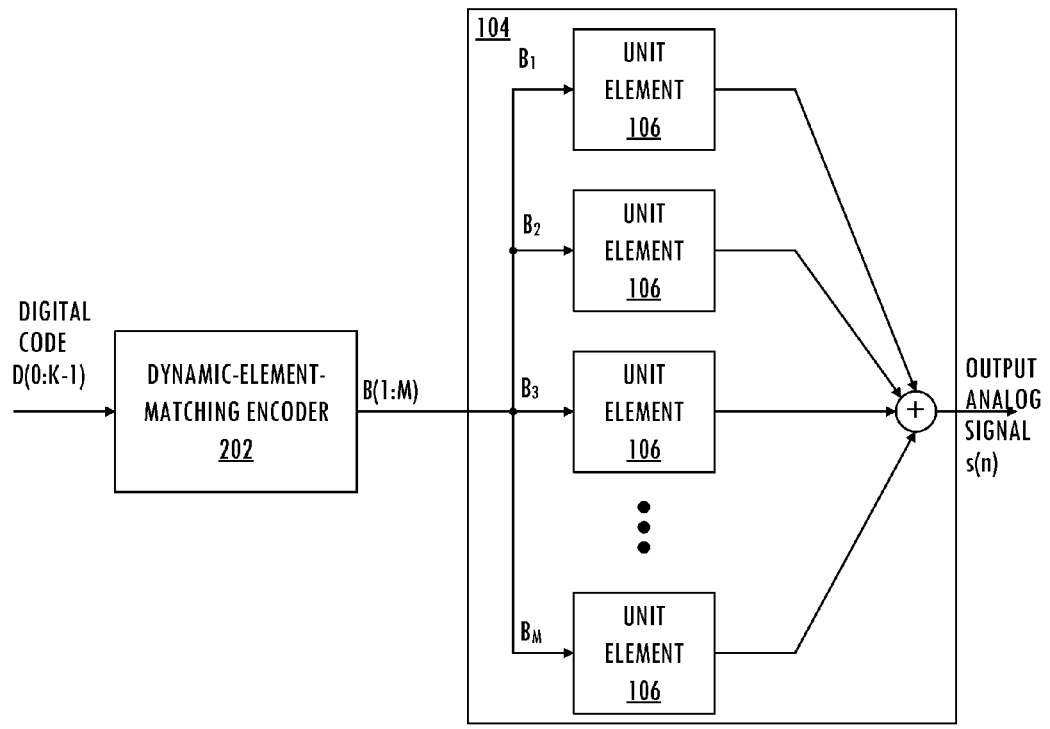
FIG. 2 illustrates a functional block diagram of a conventional dynamic-element-matching, thermometer-coded digital-to-analog converter.
Figure 5:
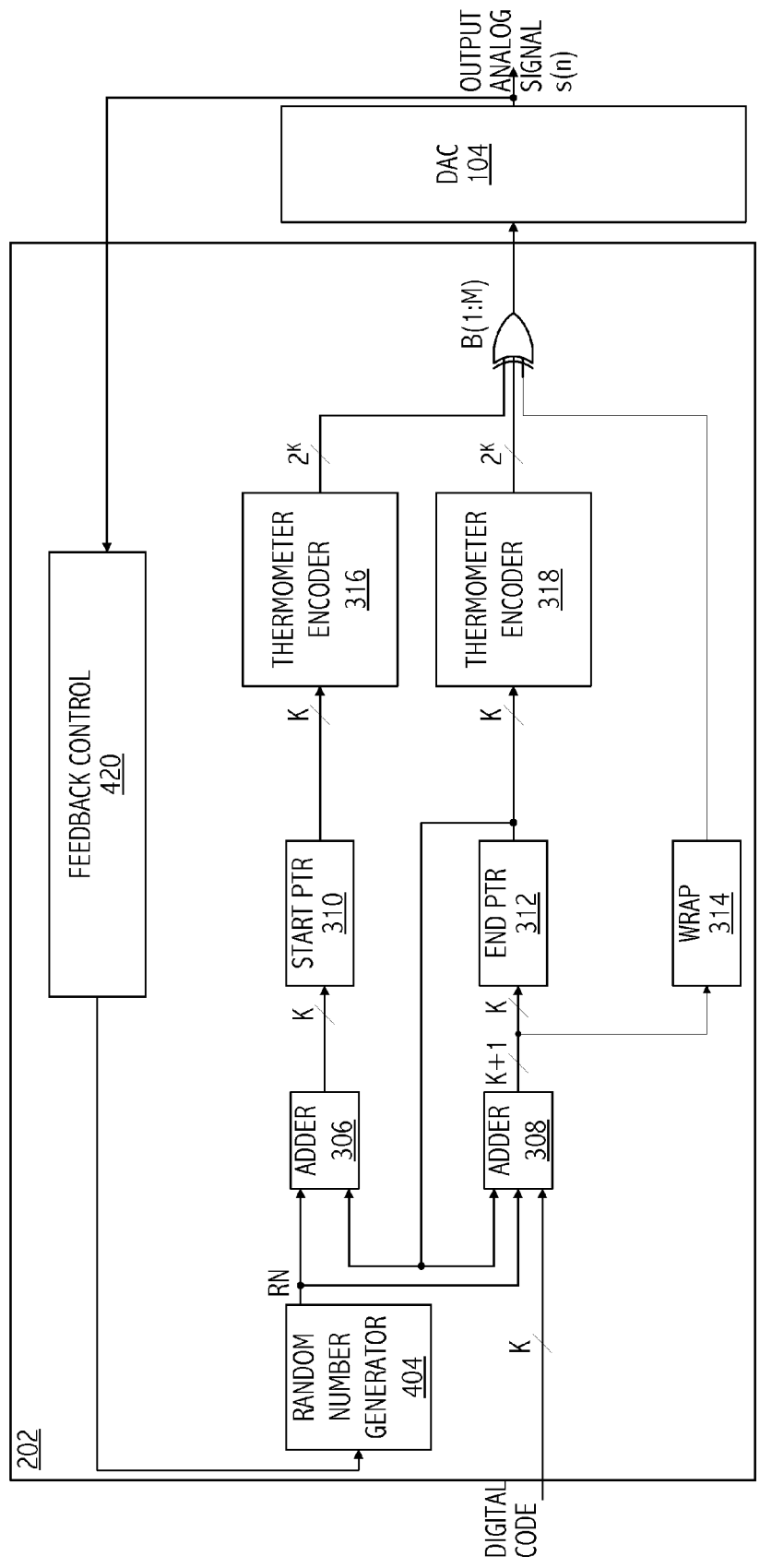
FIG. 5 illustrates a functional block diagram of a modified $1^{st}$ order noise-shaping dynamic-element-matching, thermometer-coded digital-to-analog converter having a selectable amount of noise-shaping consistent with at least one embodiment of the invention.

Referring to FIGS. 2 and 5, in at least one embodiment, dynamic-element-matching encoder 202 includes feedback controller 420, which generates an indicator of a number of bits for the random digital code based on the analog signal outputs of unit elements 106 or their sum, i.e., the output analog signal. In at least one embodiment, feedback controller 420 samples the output analog signal and generates a measurement of the performance of the modified $1^{st}$ order noise-shaping dynamic-element-matching digital-to-analog conversion technique. For example, feedback controller 420 computes an error signal, e(n), and generates spur performance measurements and noise level measurements. Feedback controller 420 compares one or more of those measurements to corresponding predetermined target values. If both are with target ranges, then feedback controller 420 does not change the number of bits of the random digital code. If one of the measurements is outside a target range, then feedback controller 420 will increase or decrease the number of bits to increase the spur performance at the cost of noise performance or increase the noise performance and decrease the spur performance and bring the offending measurement in range. If both measurements are outside corresponding target ranges, feedback controller will change the number of bits to bring the noise performance and spur performance as close as possible to the corresponding target ranges and/or achieve a target balance of the two performance measurements.

Figure 6:
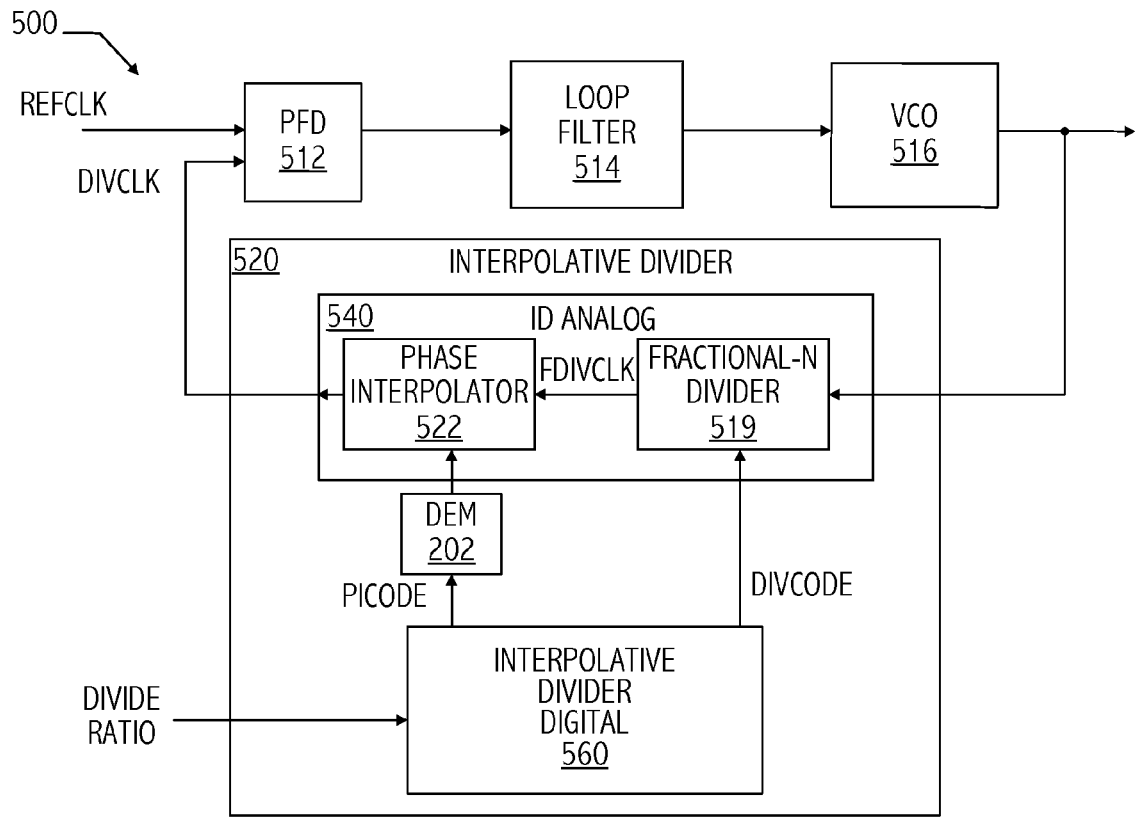
FIG. 6 illustrates a functional block diagram of a clock synthesizer including a phase interpolator code generated using a modified $1^{st}$ order noise-shaping dynamic-element-matching digital-to-analog converter circuit with feedback control consistent with at least one embodiment of the invention.

The modified $1^{st}$ order noise-shaping dynamic-element-matching digital-to-analog conversion technique described herein can be used in various applications. Referring to FIG. 6, the modified $1^{st}$ order dynamic-element-matching digital-to-analog conversion technique described herein is utilized in a clock synthesizer phase-locked loop (PLL) application to enhance linearity of an interpolative divider. Phase-locked loop 500 includes a phase/frequency detector 512, a loop filter 514, and a voltage-controlled oscillator (VCO) 516. Voltage controlled oscillator 516 may be implemented as a ring oscillator, an LC oscillator, or other suitable oscillator structure. Phase/frequency detector 512 receives a reference clock signal, REFCLK, which can be provided by a fixed source such as a crystal oscillator, a microelectromechanical structure (MEMS) oscillator, or other suitable source. Fractional-N divider 519 introduces a digital quantization error that causes phase noise (i.e., jitter) in the feedback clock signal FDIVCLK. For example, FDIVCLK may have jitter of up to one VCO clock cycle.

Figure 7:
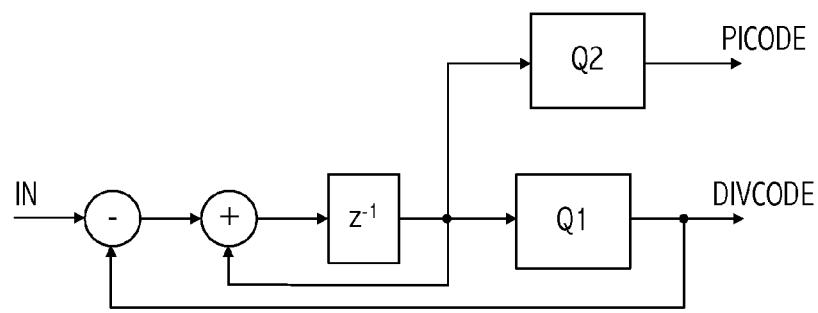
FIG. 7 illustrates a functional block diagram of a digital portion of the interpolative divider of FIG. 5.

Phase-locked loop 500 reduces jitter by adjusting the phase of the frequency-divided signal according to a phase error control signal, PICODE, generated by interpolative divider 520, which is in the feedback path of PLL 500. Interpolative divider techniques for reducing noise associated with a fractional-N divider are described in U.S. Pat. No. 7,417,510, filed Oct. 17, 2006, entitled "Direct Digital Interpolative Synthesis," naming Yunteng Huang as inventor, which application is hereby incorporated by reference. Interpolative divider 520 includes analog module 540 that includes phase interpolator 522 and fractional-N divider 519. Phase interpolator 522 adjusts the phase of FDIVCLK according to the digital quantization error to reduce error in DIVCLK, thereby introducing a phase adjustment prior to phase/frequency detector 512 of PLL 500. Interpolative divider 520 includes a digital module 560, which may include a typical first-order sigma-delta modulator (e.g., FIG. 7). Referring back to FIG. 6, digital module 560 generates the DIVCODE for fractional-N divider 519. In addition, digital module 560 generates the PICODE and supplies it to dynamic-element-matching encoder 202, which supplies control signals to a thermometer-coded digital-to-analog converter in phase interpolator 522. Phase interpolator 522 interpolates between the frequency-divided signal and one or more delayed versions of the frequency-divided signal (one or more equally-spaced phases of the frequency-divided signal) based on the PICODE, which corresponds to the phase error, using techniques that are well known in the art.

Figure 8A:
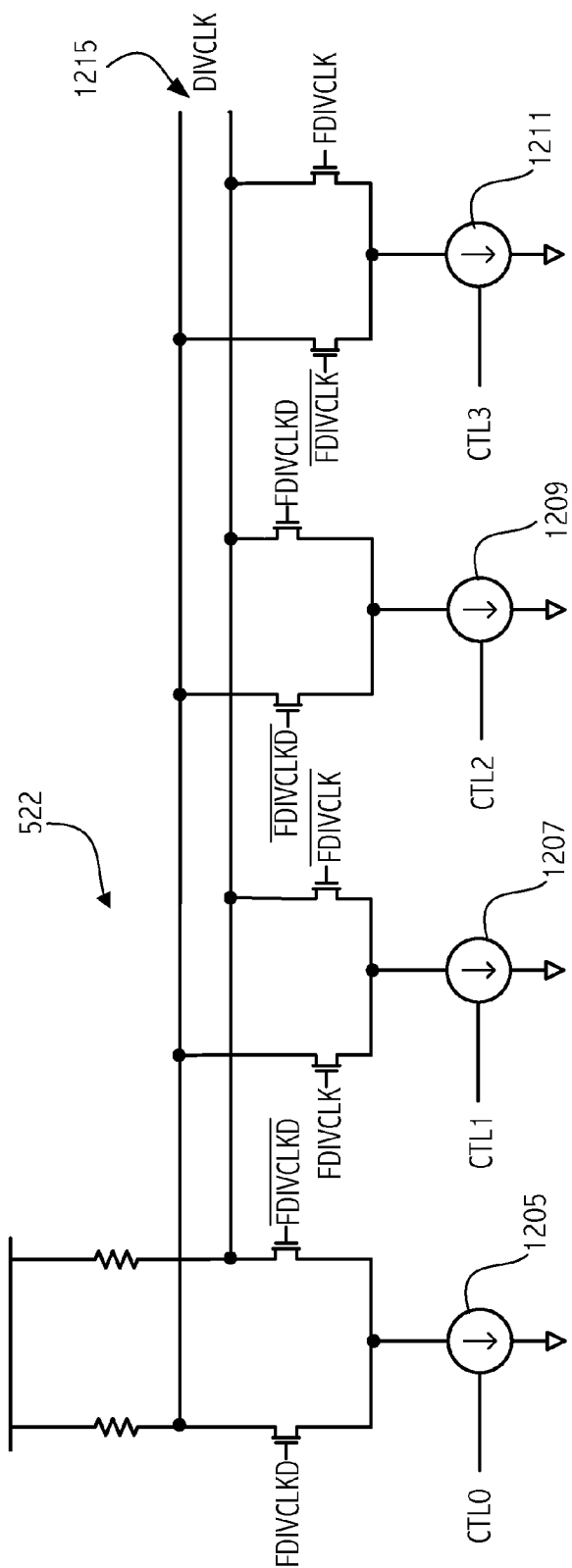
FIG. 8A illustrates an exemplary phase interpolator that may be included in the interpolative divider of FIG. 6.
Figure 8C:
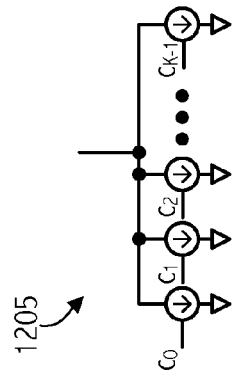
FIG. 8C illustrates an exemplary current source that may be used by the phase interpolator of FIG. 8A.
Figure 8B:
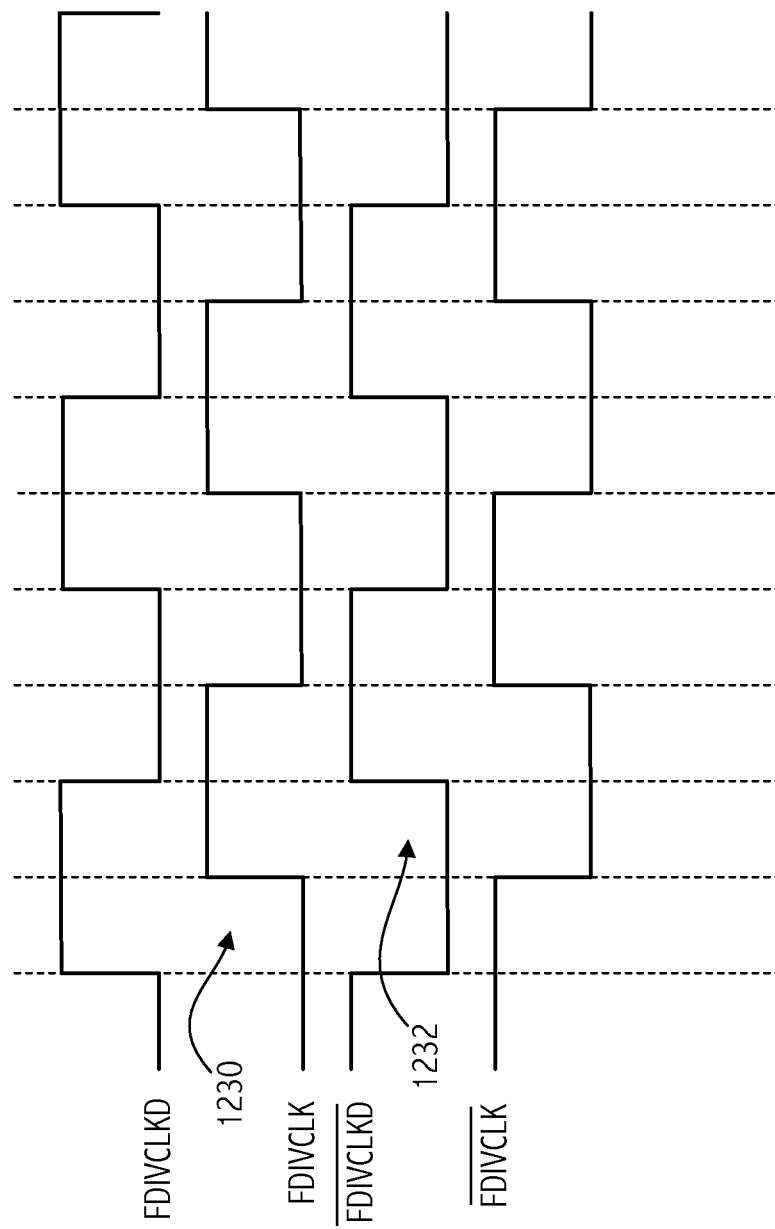
FIG. 8B illustrates a timing diagram of exemplary phases supplied to the phase interpolator of FIG. 8A.

For example, phase interpolator 522 generates multiple equally-spaced phases of FDIVCLK and interpolates appropriate ones of those phases to generate DIVCLK. An exemplary phase interpolator 522 is shown in FIG. 8A. FDIVCLK and its complement, $\overline{FDIVCLK}$, and versions of those signals delayed by one-half the clock period of VCO 516, FDIVCLKD and $\overline{FDIVCLKD}$, respectively, are used by interpolator 522. FIG. 8B illustrates exemplary waveforms for FDIVCLK, $\overline{FDIVCLK}$, FDIVCLKD, and $\overline{FDIVCLKD}$. Note that while FDIVCLK is illustrated in other figures as a single-ended signal for ease of understanding, differential signaling and differential circuits may be used. In the embodiment in FIG. 8A, four current sources 1205, 1207, 1209, and 1211 are coupled to determine the interpolated differential output clock signal DIVCLK supplied on nodes 1215. The digital quantization error is used to control the operation of the current sources 1205, 1207, 1209, and 1211.

Assume, for example, the digital quantization error of the sigma-delta modulator is eight bits. Two bits may be used to select which of the current sources shown in FIG. 8A are enabled. With two bits, up to four different pairs of current sources can be selected. Referring to FIG. 8A and FIG. 8B, if the quantization error indicates that the properly interpolated waveform should be in region 1230, then the interpolator utilizes FDIVCLK and FDIVCLKD and selects current sources 1205 and 1207 to be used for the interpolation. Similarly, if the quantization error indicates the properly interpolated waveform should be in region 1232, then the interpolator can utilize current sources 1207 and 1209 to interpolate between FDIVCLKD and FDIVCLK. Similarly, other appropriate pairs of current sources can be used by the interpolator based on the quantization error. Assuming that two bits of the eight-bit quantization error are used to select the current source pairs, the remaining six bits are used to generate appropriate control values for CTL0, CTL1, CTL2, and CTL3 to provide appropriate digital-to-analog conversion control, i.e., the strength of the current, for the various current sources based on the digital quantization error. Other interpolator implementations may be used based on such factors as the accuracy required, power considerations, design complexity, chip area available, and the number of bits used to represent the digital quantization error. Referring back to FIG. 6, interpolative divider 520 provides the output of phase interpolator 522 to phase/frequency detector 512.

Phase interpolator 522 delays the output signal of fractional-N divider 519 according to the value of PICODE. For example, PICODE may have F bits (e.g., F=8), corresponding to $P=2^F$ (e.g., 256) different $PICODE_i$ (e.g., $0 \le i \le P-1$), which correspond to P different delay values. A maximum delay is introduced by a PICODE (e.g., $PICODE_{P-1}$) corresponding to a target maximum delay of almost one VCO cycle (e.g., a delay of 255/256×a period of one VCO cycle). The target delay precision may be one VCO cycle divided by P. Performance of the PLL degrades if an actual delay resulting from a PICODE-to-delay conversion does not correspond to the target delay for the PICODE-to-delay conversion. Techniques to increase linearity of the PICODE-to-delay conversion of phase interpolator 122 and reduce spurs in DIVCLK are described in U.S. patent application Ser. No. 13/592,160, entitled "Interpolative Divider Linearity Enhancement Techniques," naming Xue-Mei Gong, Adam B. Eldredge, and Susumu Hara as inventors, filed on Aug. 22, 2012, which application is hereby incorporated by reference.

Figure 1:
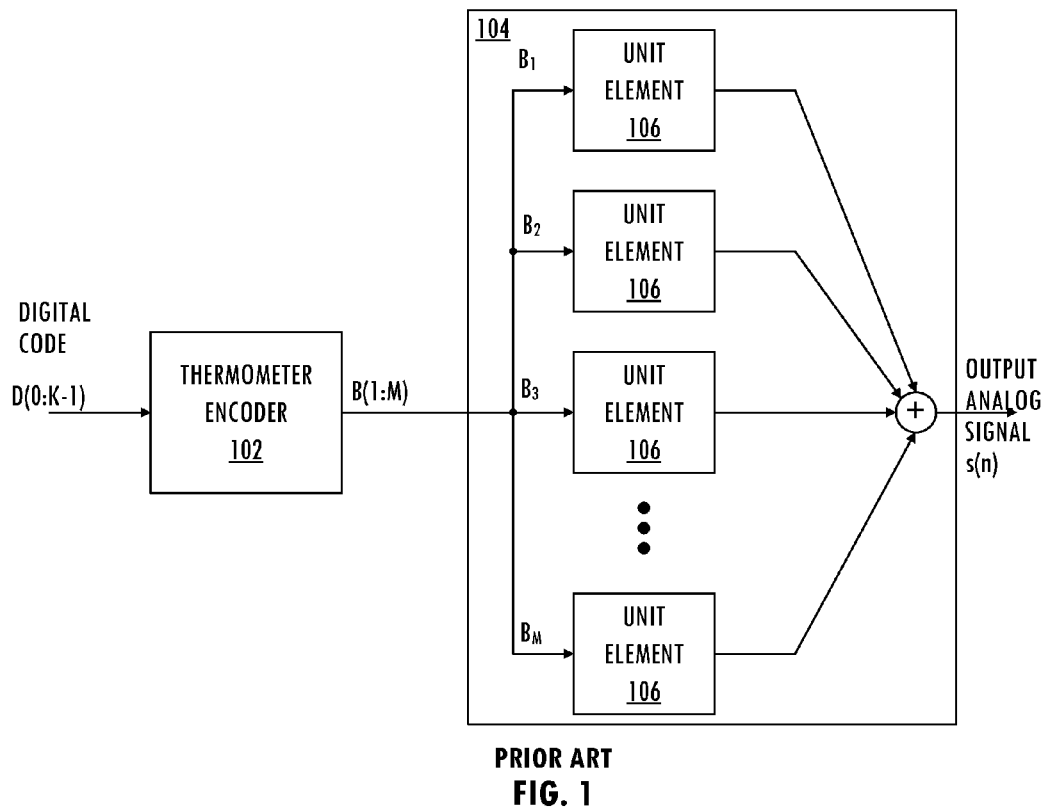
FIG. 1 illustrates a functional block diagram of a conventional thermometer-coded digital-to-analog converter.

In at least one embodiment of PLL 500, target performance is achieved by converting the phase interpolator code (e.g., CTL0, CTL1, CTL2, and CTL3) to analog phase interpolator control signals (e.g., $c_0, c_1, c_2, \ldots, c_{K-1}$ for each current source 1205, 1207, 1209, and 1211) using a current digital-to-analog converter. Modified $1^{st}$ order noise-shaping dynamic-element-matching encoders 202 convert the PICODE, which may be periodic, to a plurality of digital control signals that are provided to interpolative divider analog circuit 540. Interpolative divider analog circuit 540 includes a digital-to-analog converter that converts those control signals to individual analog control signals (e.g., by using digital-to-analog converter 104 of FIG. 1 without the final summations) and provides the analog control signals to current sources in phase interpolator 522. In an embodiment of PLL 500 that includes a dynamic-element-matching encoder 202 that dynamically selects the unit elements in the phase interpolator as described above, the outputs of the current sources of phase interpolator 522 are used as feedback signals. Dynamic-element-matching encoder 202 reduces tones in the phase interpolator output signal. High-frequency noise introduced by dynamic-element-matching encoder 202 is attenuated by loop filter 514 of PLL 500. Accordingly, the reduction or elimination of spurs in the PICODE of an interpolative divider of a clock synthesizer improves the performance of PLL 500.

Thus, embodiments of a multi-bit digital-to-analog converter have been described. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which the modified $1^{st}$ order noise-shaping dynamic-element-matching digital-to-analog conversion technique is used in a clock synthesizer application, one of skill in the art will appreciate that the teachings herein can be utilized in sigma-delta data converters and other applications that use digital-to-analog converters. In addition, while the invention has been described in an embodiment including thermometer-coded digital-to-analog converters, one of skill in the art will appreciate that the teachings herein can be utilized in hybrid digital-to-analog converters that use a combination of digital-to-analog converter techniques, e.g., a segmented digital-to-analog converter that combines a thermometer coded digital-to-analog converter for the most-significant bits and a binary-coded digital-to-analog converter for the least-significant bits. Variations and modifications of the embodiments disclosed herein may be made based on the description set forth herein, without departing from the scope and spirit of the invention as set forth in the following claims.

What is claimed is:

1. A method comprising:
selectively enabling a first sequence of unit elements of a plurality of unit elements of a digital-to-analog converter to convert a digital code to a plurality of analog signals in response to a plurality of control signals, individual control signals of the plurality of control signals and individual analog signals of the plurality of analog signals corresponding to respective unit elements of the plurality of unit elements; and
generating the plurality of control signals based on the digital code, a random digital code having a number of bits based on a feedback signal, and an indicator of a second sequence of unit elements of the plurality of unit elements enabled in response to a prior digital code.

2. The method, as recited in claim 1, further comprising:
adjusting the number of bits of the random digital code based on the feedback signal and at least one of a target periodic error and a target noise level.

3. The method, as recited in claim 1, wherein the indicator is a pointer to a unit element of the plurality of unit elements corresponding to a transition from enabled unit elements to disabled unit elements of the plurality of unit elements associated with the prior digital code.

4. The method, as recited in claim 1, wherein the generating the plurality of control signals comprises:
generating a start pointer indicating a next element to be enabled is a first unit element of the first sequence, an end pointer indicating a last unit element of the first sequence, and a wrap indicator indicating relative positions of the first unit element and the last unit element in the first sequence,
wherein the plurality of control signals are generated based on the start pointer, the end pointer, and the wrap indicator.

5. The method, as recited in claim 4, wherein generating the plurality of control signals further comprises:
converting the start pointer to a thermometer-coded start pointer; and
converting the end pointer to a thermometer-coded end pointer.

6. The method, as recited in claim 5, wherein generating the plurality of control signals further comprises:
performing an exclusive-OR of the thermometer-coded start pointer, the thermometer-coded end pointer, and the wrap signal to generate the plurality of control signals.

7. The method, as recited in claim 4, wherein the start pointer is generated based on the random digital code and a prior end pointer indicating a last unit element of the second sequence.

8. The method, as recited in claim 4, wherein the generating the start pointer, the end pointer, and the wrap indicator comprises:
adding the random digital code to a prior end pointer indicating a last unit element of the second sequence to generate the start pointer; and
adding the random digital code and the digital code to the prior end pointer to generate the end pointer and the wrap indicator.

9. The method, as recited in claim 1, further comprising:
controlling a phase interpolator of an interpolative divider of a phase-locked loop based on the plurality of analog signals, wherein the digital code is based on a predetermined divide ratio.

10. An apparatus comprising:
a digital-to-analog converter circuit comprising a plurality of unit elements configured to convert a digital code to a plurality of analog signals in response to a plurality of control signals, individual control signals of the plurality of control signals and individual analog signals of the plurality of analog signals corresponding to respective unit elements of the plurality of unit elements, the plurality of control signals selectively enabling a first sequence of unit elements to be enabled; and
a control circuit configured to generate the plurality of control signals based on the digital code, a random digital code having a number of bits based on a feedback signal, and an indicator of a second sequence of unit elements of the plurality of unit elements enabled in response to a prior digital code.

11. The apparatus, as recited in claim 10, further comprising:
a feedback controller configured to adjust the number of bits of the random digital code based on the feedback signal and at least one of a target periodic error and a target noise level.

12. The apparatus, as recited in claim 10, wherein the indicator is a pointer to a unit element of the plurality of unit elements corresponding to a transition from enabled unit elements to disabled unit elements of the plurality of unit elements associated with the prior digital code.

13. The apparatus, as recited in claim 10, wherein the control circuit comprises:
a first circuit configured to generate a start pointer indicating a next element to be enabled is a first unit element of the first sequence, an end pointer indicating a last unit element of the first sequence, and a wrap indicator indicating relative positions of the first unit element and the last unit element in the first sequence; and
a second circuit configured to generate the plurality of control signals based on the start pointer, end pointer, and wrap indicator.

14. The apparatus, as recited in claim 13, wherein the first circuit comprises:
a pseudo-random number generator configured to generate the random digital code; and
a first adder configured to generate the start pointer based on the random digital code and a prior end pointer indicating a last unit element of the second sequence.

15. The apparatus, as recited in claim 14, wherein the control circuit further comprises:
a second adder configured to generate the end pointer and the wrap indicator based on the prior end pointer, the random digital code, and the digital code.

16. The apparatus, as recited in claim 14, wherein the converter circuit comprises:
a first converter configured to convert the start pointer from a binary code to a start pointer thermometer code; and
a second converter configured to convert the end pointer from a binary code to an end pointer thermometer code.

17. The apparatus, as recited in claim 16, wherein the converter circuit comprises a logic circuit configured to exclusive-OR the start pointer thermometer code, the end pointer thermometer code, and the wrap indicator to generate the plurality of control signals.

18. The apparatus, as recited in claim 10, wherein the digital-to-analog converter circuit is a K-bit converter circuit and the plurality of unit elements includes $2^K-1$ individually controllable unit elements.

19. The apparatus, as recited in claim 10, further comprising:
a phase-locked loop comprising an interpolative divider including a phase interpolator controlled by the plurality of analog signals, the digital code being generated based on a predetermined divide ratio.

20. An apparatus comprising:
means for converting a digital code to a plurality of analog signals based on a plurality of control signals, each of the plurality of control signals and each of the plurality of analog signals corresponding to a respective unit element of a plurality of unit elements, the plurality of control signals selectively enabling a first sequence of unit elements to be enabled; and
means for generating the plurality of control signals based on a digital code, a random digital code having a number of bits based on a feedback signal, and an indicator of values of the plurality of control signals generated corresponding to a prior digital code.

* * * * *

UNITED STATES PATENT AND TRADEMARK OFFICE
CERTIFICATE OF CORRECTION

| | | |
|---|---|---|
| PATENT NO. | : 8,736,476 B2 | Page 1 of 1 |
| APPLICATION NO. | : 13/664902 | |
| DATED | : May 27, 2014 | |
| INVENTOR(S) | : Xue-Mei Gong and Douglas F. Pastorello | |

It is certified that error appears in the above-identified patent and that said Letters Patent is hereby corrected as shown below:

On the title page item (72) Inventors, replace "Patorello" with --Pastorello--.

Signed and Sealed this
Fourth Day of November, 2014

Michelle K. Lee
*Deputy Director of the United States Patent and Trademark Office*